United States Patent [19]

Bumgardner

[11] Patent Number: 4,622,725
[45] Date of Patent: Nov. 18, 1986

[54] FASTENER FOR MOUNTING A CIRCUIT BOARD OR THE LIKE TO A FRAME

[75] Inventor: Donald L. Bumgardner, South Lyon, Mich.

[73] Assignee: Northern Telecom Limited, Montreal, Canada

[21] Appl. No.: 778,133

[22] Filed: Sep. 20, 1985

[51] Int. Cl.[4] .............................................. F16B 13/04
[52] U.S. Cl. ...................................... 24/453; 24/297; 174/138 D; 411/508
[58] Field of Search ................ 24/453, 295, 296, 297; 411/508, 509, 510; 174/138 D

[56] References Cited

U.S. PATENT DOCUMENTS

| | | |
|---|---|---|
| 2,260,048 | 10/1941 | Newell ............................ 174/138 D |
| 2,958,914 | 11/1960 | Krach ........................ 24/453 |
| 3,249,973 | 5/1966 | Seckerson ........................ 24/297 |
| 3,382,476 | 5/1968 | Novet . |
| 3,611,861 | 10/1971 | Schulze ............................ 411/508 |
| 3,621,751 | 11/1971 | Fiorentino ............................ 24/453 |
| 3,742,309 | 6/1973 | Sterner . |
| 3,744,101 | 7/1973 | Gley ............................ 24/453 |
| 4,007,516 | 2/1977 | Coules ............................ 174/138 D |
| 4,143,577 | 3/1979 | Eberhardt ........................ 174/138 D |
| 4,470,737 | 9/1984 | Wollar ............................ 24/453 |

FOREIGN PATENT DOCUMENTS 1220673  7/1966  Fed. Rep. of Germany ........ 24/297

*Primary Examiner*—Victor N. Sakran
*Attorney, Agent, or Firm*—Schwartz, Jeffery, Schwaab, Mack, Blumenthal & Evans

[57] ABSTRACT

A fastener for mounting a circuit board or the like to a frame is disclosed. A mounting arrangement uses removable fasteners which are received by non-circular openings in the circuit board and rotated into engagement with the surfaces of the circuit board. The fasteners have at least two substantially parallel resilient limb members which have opposing recesses for receiving a frame member. This arrangement is especially useful for mounting non-rectangular circuit boards or for non-parallel mounting of circuit boards.

16 Claims, 8 Drawing Figures

FASTENER FOR MOUNTING A CIRCUIT BOARD OR THE LIKE TO A FRAME

BACKGROUND OF THE INVENTION

This invention relates generally to an arrangement for mounting a circuit board or the like to a frame, and more particularly to an arrangement using inexpensive, removable fasteners.

Circuit board racks in which the circuit boards are slidably mounted in channelled frame members are commonly used. U.S. Pat. No. 3,382,476 gives one example of such circuit board racks. These racks are convenient where parallel mounting of the circuit boards is desired, where the boards are rectangular, and where the number of boards and the application justify the expense.

Where non-parallel mounting of circuit boards is desired, however, or where circuit boards are not rectangular, common circuit board racks are not readily applicable. Moreover, some applications may not justify the expense of common circuit board racks.

U.S. Pat. No. 3,742,309 discloses an arrangement for assembling circuit boards in mutually parallel positions. This arrangement relies on a junction medium comprising clamps of rectangular cross-section and spring clips arranged to grasp elastically around the central part of the clamps. The spring clips and clamps are mounted in adjacent parallel circuit boards by snapping elastically springing stop media into holes in the circuit boards where they are elastically retained. The holes illustrated are circular, and no rotation is required to lock the spring clips or clamps into retaining engagement with the circuit boards. The spring clips and clamps are not easily removed from the circuit boards without tools (for example, pliers to pinch the elastically springing stop media). No means for mounting the circut board assembly to a supporting frame is disclosed. The arrangement is not readily adapted to the non-parallel mounting of circuit boards.

An object of the present invention is to provide a simple and inexpensive arrangement for mounting a circuit board or the like to a frame, readily adaptable to circumstances in which the circuit board is non-rectangular or where non-parallel mounting of circuit boards is desired.

A second object of the present invention is to provide a fastener for achieving the first object, said fastener being simple and inexpensive, and not requiring the use of tools for its insertion or removal.

SUMMARY OF THE INVENTION

The present invention is directed to a relatively simple and economical arrangement for mounting circuit boards or the like to a frame. This invention employs relatively inexpensive fasteners which are received by non-circular openings in the circuit board and rotated into engagement with the surfaces of the circuit board. Each fastener has a plurality of substantially parallel resilient limb members which have opposing recesses for receiving and removably retaining a frame member, which may conveniently be formed from cylindrical wire.

Stated in more detail, one aspect of the present invention provides an assembly which comprises a circuit board or the like having at least one non-circular opening for receiving at least one fastener, a frame which comprises at least one frame member for supporting the circuit board, and at least one fastener for fastening the circuit board to the frame.

Preferably, a plurality of openings may be used with a plurality of fasteners, one fastener per opening, to achieve a stable mounting.

Each fastener further comprises a non-circular head member for inserting into an opening through the circuit board and rotating into engagement with a first surface of the circuit board, a neck member connected to the head member for extending through the opening, and at least two substantially parallel resilient limb members separated by a gap and connected to the neck member, the limb members have shoulders for engaging a second surface of the circuit board, and having opposing recesses for receiving a frame member.

Conveniently, the frame may be formed from cylindrical wire.

DESCRIPTION OF THE DRAWINGS

The invention will now be described in more detail with reference to the accompanying drawings. In these drawings, like parts in each of the several figures are identified by the same reference character.

FIG. 1a sectional view of the same embodiment taken through the section line 1b—1b of FIG. 1a, while FIG. 1c is a sectional view of the same embodiment taken through section line 1c—1c of FIG. 1a. FIGS. 1a, 1b, 1c and 1d will be referred to collectively as FIG. 1;

FIG. 3b is a sectional view taken through section line 3b—3b of FIG. 3a.

DETAILED DESCRIPTION

Figure 1A:
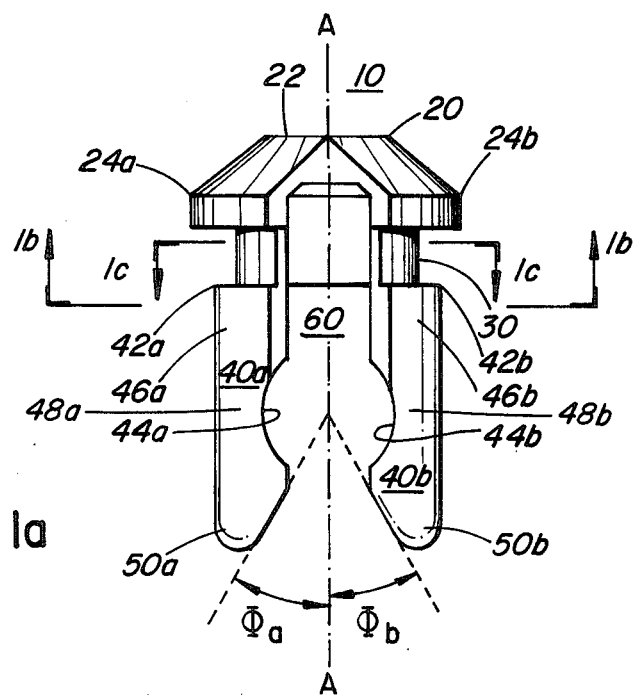
FIG. 1a is an elevation view of a preferred embodiment of the fastener.

FIG. 1a depicts fastener 10 constructed according to one embodiment of the present invention. Fastener 10 has a non-circular head member 20, a neck member 30 connected to the head member, and two substantially parallel resilient limb members 40a and 40b, separated by a gap 60 and connected to the neck member. The limb members 40a and 40b, have shoulders 42a and 42b respectively, and opposing recesses 44a and 44b respectively.

Limb member 40a has a first end portion 46a connected to the neck member 30 and bearing the shoulder 42a. A middle portion 48a bearing the recess 44a is connected to the first end portion 46a. A second end portion 50a, tapered at an angle $\Phi_a$ to the longitudinal axis A of the fastener, is connected to the middle portion 48a.

In a similar manner, limb member 40b has a first end portion 46b bearing the shoulder 42b, a middle portion 48b bearing the recess 44b and a second end portion 50b tapered at an angle $\Phi_b$ to longitudinal axis A.

Note that gap 60 widens between the second portions 50a and 50b of the limb members 40a and 40b due to taper angles $\Phi_a$ and $\Phi_b$.

Figure 1B:
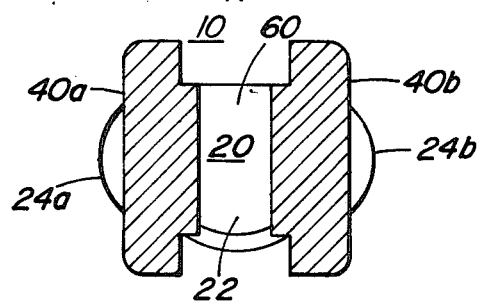

FIG. 1b is a sectional view of the same embodiment of the fastener taken along section line 1b–1b in FIG. 1a. This view shows the cross-section of limb members 40a and 40b.

Figure 1C:
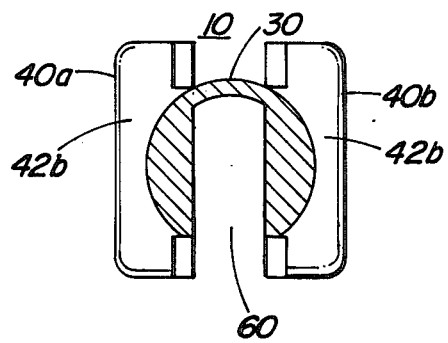

FIG. 1c is a sectional view of the same embodiment of the fastener taken along section line 1c–1c in FIG. 1a. This view shows the cross-section of neck member 30.

Figure 1D:
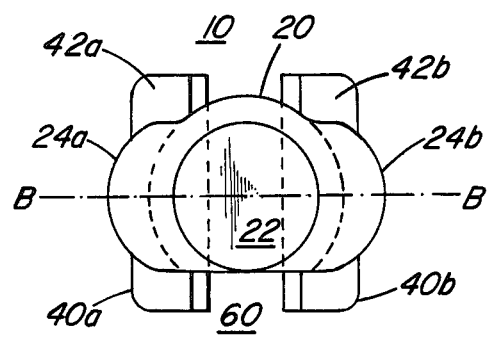
FIG. 1d is a plan view of the same embodiment of the fastener.

FIG. 1d shows a plan view of the same embodiment of the fastener. The head member 20 comprises a circular core member 22 and ear members 24a and 24b aligned on a diameter B of the core member.

Figure 2:
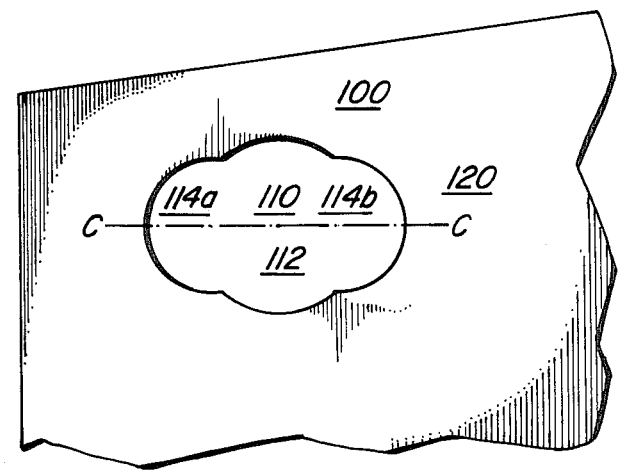
FIG. 2 depicts the preferred shape for the opening through the circuit board which receives the preferred embodiment of the fastener illustrated in FIG. 1.

FIG. 2 depicts a plan view of a portion of the circuit board 100, showing one embodiment of the opening designed to receive the fastener. The opening 110 comprises a circular central hole 112 and two notches 114a and 114b adjoining the central hole and aligned on a diameter C of the central hole.

The head member 20 and the opening 110 are dimensioned so that the head member can pass through the opening only when the ear members 24a and 24b are substantially aligned with the notches 114a and 114b.

The fastener 10 is installed in the circuit board 100 by aligning ear members 24a and 24b with notches 114a and 114b, pushing head 20 through opening 110 until shoulders 42a and 42b contact surface 130 of the circuit board, and rotating the fastener approximately 90° so that the ear members 24a and 24b engage surface 120 of the circuit board.

Once the fastener 10 is installed in the circuit board 100, the frame member 1000 (shown in FIGS. 3a, 3b and 4) may be installed in opposing recesses 44a and 44b. This is accomplished by pressing the frame member 1000 into the gap 60 between the tapered end portions 50a and 50b, and springing resilient limb members 40a and 40b apart until the frame member snaps into place between opposing recesses 44a and 44b.

Reversal of the steps described above will demount the circuit board 100 from the frame 1000. Note that no tools are required to mount or demount the circuit board.

Figure 3A:
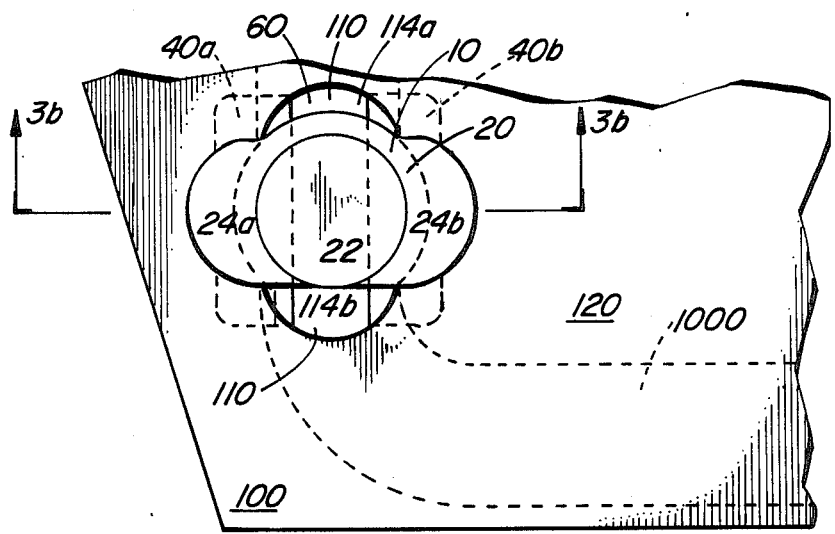
FIG. 3a is a plan view of the fastener illustrated in FIG. 1 retained in the opening depicted in FIG. 2 and retaining a frame member.
Figure 4:
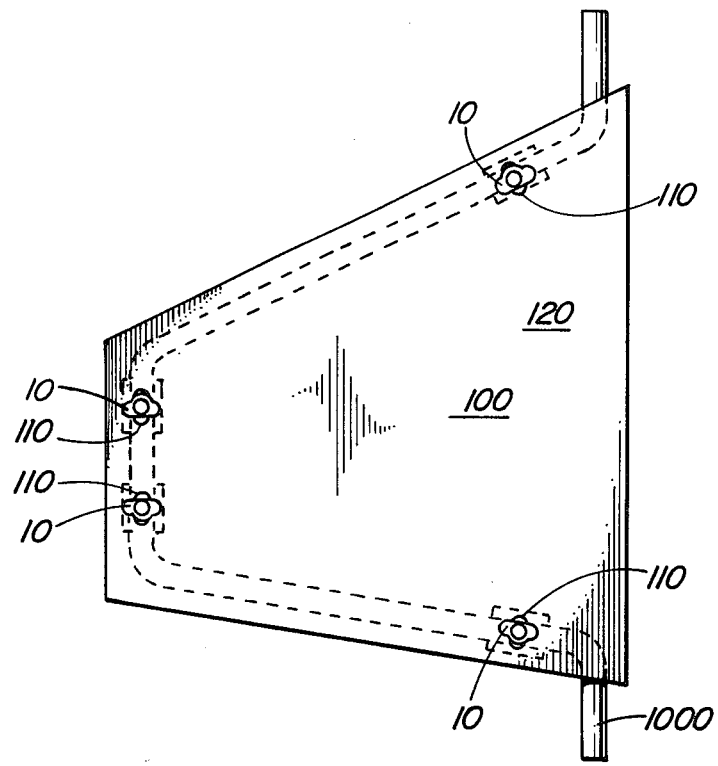
FIG. 4 is a plan view of a circuit board mounted on a frame member using four fasteners of the type illustrated in FIG. 1.

FIG. 3a depicts a plan view of a portion of a circuit board mounted to a frame according to one embodiment of the present invention. The circuit board 100 is mounted to frame member 1000 using fastener 10 installed in opening 110. The ear members 24a and 24b of the head member 20 are misaligned with the notches 114a and 114b of the opening 110. Consequently the ear members 24a and 24b engage the surface 120 of the circuit board 100.

Figure 3B:
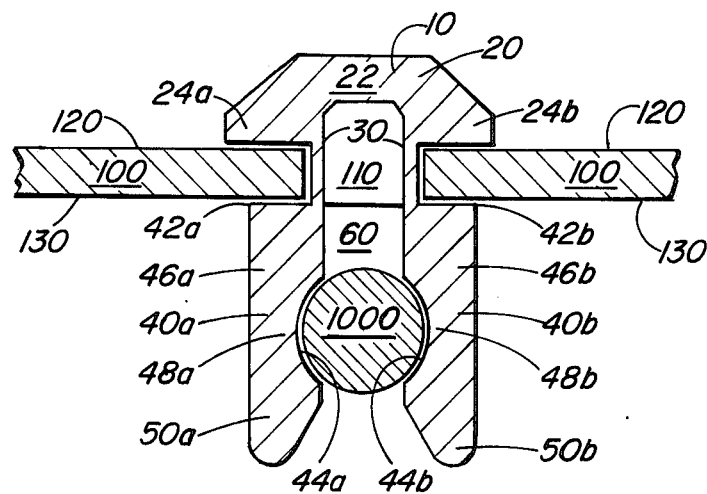

FIG. 3b is a sectional view of this assembly taken along section line 3b–3b in FIG. 3a. The circuit board 100 has an opening 110 which receives the fastener 10. The frame comprises frame member 1000. The fastener 10 has a head member 20 which has been pushed through opening 110 and rotated until ear members 24a and 24b engage a first surface 120 of the circuit board 100. A neck member 30 connected to the head member 20 extends through the opening 110. Shoulders 42a and 42b on resilient limb members 40a and 40b engage a second surface 130 of the circuit board 100. Opposing recesses 44a and 44b on limb members 40a and 40b receive frame member 1000. The recesses 44a and 44b are contoured to substantially conform to surfaces of frame member 1000 which is formed from cylindrical wire.

Preferably, a plurality of fasteners is used with a plurality of openings, one fastener per opening, to achieve a stable mounting. See FIG. 4 for example, which shows a circuit board 100 mounted on a single frame member 1000 by four fasteners 10 mounted in four holes 110.

In the preferred embodiment, the ear members 24a and 24b are axially aligned with the limb members 40a and 40b, the angles $\Phi_a$ and $\Phi_b$ are approximately 30° and fastener 10 is constructed from nylon.

Frames constructed of cylindrical wire are easy and inexpensive to manufacture and can be readily adapted to non-parallel mounting of circuit boards of any shape. The fasteners described are also relatively inexpensive, simple to manufacture, and can be installed or removed without tools. Thus the invention disclosed provides a relatively simple and low cost arrangement for the mounting of non-rectangular circuit boards and for the non-parallel mounting of circuit boards.

Note that many of the features described above are features of the preferred embodiment only, and are not essential to the invention as claimed below.

What is claimed is:

1. A fastener for mounting a circuit board or the like to a frame member, said fastener comprising:
   a non-circular head member for inserting into an opening through the circuit board and rotating into engagement with a first surface of the circuit board;
   a neck member connected to the head member for extending through the opening; and
   at least two substantially parallel resilient limb members for resiliently springing apart to receive said frame member and for resiliently springing back to retain the frame member, each of said limb members comprising:
   (a) a first end portion connected to the neck member and having a shoulder for engaging a second surface of the circuit board;
   (b) a middle portion connected to the first end portion and having a recess for receiving and retaining the frame member; and
   (c) a second end portion connected to the middle portion; and
   adjacent limb members having a gap therebetween which widens between the second end portions of said limb members and which communicates with said recess.

2. The fastener of claim 1 wherein the head member comprises a circular core member connected to the neck member and at least one ear member connected to the core member.

3. The fastener of claim 2 wherein the head member has exactly two ear members aligned on a diameter of the circular core member.

4. The fastener of claim 1 wherein the second end portion of at least one limb member tapers so as to widen the gap separating adjacent limb members.

5. The fastener of claim 1 wherein exactly two limb members are provided, and the second end portions of both limb members taper so as to widen the gap separating the limb members.

6. The fastener of claim 1 wherein the recesses are contoured to substantially conform to surfaces of the frame member.

7. The fastener of claim 1 wherein said frame member is cylindrical:
   the head member comprises two ear members aligned on a diameter of a circular core member;
   each ear member axially aligned with one limb member;

said middle portion of each limb member having its recess contoured to substantially conform to surfaces of said cylindrical frame member, for receiving the frame member; and said second end portion of each limb member tapered at an angle approximately equal to 30° so as to widen the gap separating the limb members.

8. The fastener of claim 7 wherein said fastener is constructed from nylon.

9. An assembly comprising:

a circuit board or the like having at least one non-circular opening for receiving at least one fastener;

a frame comprising at least one frame member for supporting said circuit board; and at least one fastener for fastening the circuit board to the frame;

each fastener comprising:

a non-circular head member for inserting into one of the openings and rotating into engagement with a first surface of the circuit board;

a neck member connected to the head member for extending through said one of the openings; and at least two substantially parallel resilient limb members for resiliently springing apart to receive said frame member and for resiliently springing back to retain the frame member, each of said limb members comprising:

(a) a first end portion connected to the neck member and having a shoulder for engaging a second surface of the circuit board;

(b) a middle portion connected to the first end portion and having a recess for receiving and retaining the frame member; and (c) a second end portion connected to the middle portion; and adjacent limb members having a gap therebetween which widens between the second end portions of said limb members and which communicates with said recess.

10. The assembly of claim 9 wherein:

the head member comprises a circular core member connected to the neck member and at least one ear member connected to said core member;

the opening comprises a circular central hole and at least one notch adjoining said hole; and the head member can pass through the opening only when the ear members are substantially aligned with the notches.

11. The assembly of claim 10 wherein:

each head member has exactly two ear members aligned on a diameter of the circular core member; and each opening has exactly two notches aligned on a diameter of the circular central hole.

12. The assembly of claim 9 wherein the second end portion of at least one limb member tapers so as to widen the gap separating adjacent limb members.

13. The assembly of claim 9 wherein exactly two limb members are provided on each fastener, and the second end portions of both limb members taper so as to widen the gap separating the limb members.

14. The assembly of claim 9 wherein the recesses are contoured to substantially conform to surfaces of the frame member.

15. The assembly of claim 9 wherein the frame member is formed from cylindrical wire.

16. The assembly of claim 10 wherein said frame member is cylindrical:

each head member comprises exactly two ear members aligned on a diameter of a circular core member;

each ear member is axially aligned with one limb member;

said middle portion of each limb member having its recess contoured to substantially conform to surfaces of said cylindrical frame member, for receiving the frame member; and said second end portion of each limb member tapered at an angle approximately equal to 30° so as to widen the gap separating adjacent limb members;

each opening comprises exactly two notches aligned on a diameter of a circular central hole, such that each head member can pass through each opening only when the ear members are substantially aligned with the notches; and the circuit board is fastened to said frame member by a plurality of fasteners received by a plurality of openings.

* * * * *